(12) United States Patent
Kim

(10) Patent No.: US 7,414,475 B2
(45) Date of Patent: Aug. 19, 2008

(54) LINEARITY-IMPROVED DIFFERENTIAL AMPLIFICATION CIRCUIT

(75) Inventor: Tae Wook Kim, Austin, TX (US)

(73) Assignee: Integrant Technologies Inc., Gyeonggi-do (KR)

( * ) Notice: Subject to any disclaimer, the term of this patent is extended or adjusted under 35 U.S.C. 154(b) by 66 days.

(21) Appl. No.: 11/466,751

(22) Filed: Aug. 23, 2006

(65) Prior Publication Data

US 2007/0046374 A1    Mar. 1, 2007

(30) Foreign Application Priority Data

Aug. 26, 2005    (KR)    ........................ 10-2005-0078532

(51) Int. Cl.
  *H03F 3/45*    (2006.01)
(52) U.S. Cl. ...................... 330/261; 330/253
(58) Field of Classification Search ................. 330/252, 330/253, 257, 261
  See application file for complete search history.

(56) References Cited

U.S. PATENT DOCUMENTS

| | | | | |
|---|---|---|---|---|
| 5,381,113 A | * | 1/1995 | Kimura | ...................... 330/253 |
| 5,481,224 A | * | 1/1996 | Kimura | ...................... 330/253 |
| 5,500,623 A | * | 3/1996 | Kimura | ...................... 330/252 |
| 5,602,509 A | * | 2/1997 | Kimura | ...................... 330/253 |
| 5,631,607 A | * | 5/1997 | Huijsing et al. | ............. 330/253 |
| 6,614,302 B2 | * | 9/2003 | Abe | ........................... 330/253 |
| 7,245,181 B2 | * | 7/2007 | Sanduleanu et al. | ......... 330/253 |

FOREIGN PATENT DOCUMENTS

JP    2000-224264    9/2000

OTHER PUBLICATIONS

P. Sivonen et al., "Cancellation of Second-Order Intermodulation Distortion and Enhancement of IIP2 in Common-Source and Common-Emitter RF Transconductors," IEEE Transactions on Circuits and Systems, vol. 52:Feb. 2, 2005, pp. 305-317.

* cited by examiner

*Primary Examiner*—Henry K Choe
(74) *Attorney, Agent, or Firm*—Foley & Lardner LLP

(57) ABSTRACT

A linearity-improved differential amplification circuit is provided, A linearity-improved differential amplification circuit comprises a main differential amplification unit differentially amplifying a first and a second input signals, a main bias unit biasing the main differential amplification unit, a first current source coupled in series between a power supply voltage terminal and the main bias unit and an auxiliary differential amplification unit differentially amplifying the first and the second input signal and coupled to the main differential amplification unit.

12 Claims, 4 Drawing Sheets

Prior Art

LINEARITY-IMPROVED DIFFERENTIAL AMPLIFICATION CIRCUIT

This non-provisional application claims priority under 35 U.S.C. § 119(a) on Patent Application No. 10-2005-0078532 filed in Korea on Aug. 26, 2005, the entire contents of which are hereby incorporated by reference.

BACKGROUND OF THE INVENTION

1. Field of the Invention

The present invention relates to a differential amplification circuit, and more particularly, to a differential amplification circuit extending an operation region and improving a linearity.

2. Description of the Background Ar

A radio frequency (RF) circuit configured with a single ended circuit often has disadvantages such as a signal coupling event and an even order distortion event in a highly integrated circuit like a system-on-a-chip (SoC).

Hence, a differential circuit is generally employed to overcome the above disadvantages.

The typical differential circuit is used more frequently in a highly integrated circuit (e.g., SoC) than in the aforementioned single ended circuit because the differential circuit has a high common mode rejection ratio (CMRR) and second-order intercept point (IIP2).

However, when the typical differential circuit uses a fully differential amplifier (FDA), an operation region may be reduced due to a voltage headroom limitation associated with the FDA.

Another type of FDA was introduced by Nokia Corporation to overcome the voltage headroom limitation The other type of FDA was taught in an article, entitled "Cancellation of Second-Order Intermodulation Distortion and Enhancement of IIP2 in Common-Source and Common-Emitter RE Transconductors" (IEEE, Vol, 52, NO. 2, February, 2005), FIG. 1 illustrates the other type of FDA introduced by Nokia Corporation.

The other type of FDA includes first to fourth transistors $MN_1$, $MN_2$, $MN_{b1}$, and $MN_{b2}$, a current source Isb, first and second bias resistors $R_B$ and $R_B$, and first and second capacitors $C_1$ and $C_2$.

The first and second transistors $MN_1$ and $MN_2$ are parts of an amplification circuit, wherein the first and second transistors $MN_1$ and $MN_2$ are configured as a differential pair that amplifies a difference between input voltages Vin+ and Vin−.

The first and second transistors $MN_1$ and $MN_2$ are biased by the first and second bias resistors $R_B$ and $R_B$, and the current source $I_{sb}$. The first and second bias resistors $R_B$ and $R_B$ have the same resistance level.

The first and second capacitors $C_1$ and $C_2$ are configured in a direct current (DC)-blocking circuit that removes a DC component from the input voltages Vin+ and Vin−. The third and fourth transistors $MN_{b1}$ and $MN_{b2}$ are configured as a bias circuit.

The first and second transistors $MN_1$ and $MN_2$, which are the differential pair of the amplification circuit, are configured to common source circuits. Due to this configuration, the first and second transistors $MN_1$ and $MN_2$ can reduce second-order intermodulation (IM2) distortion and enhance IIP2.

A method of reducing the IM2 distortion and enhancing the IIP2 by the configuration of the amplification circuit with the differential circuit is described in the aforementioned article, and thus, detailed description thereof will be omitted.

The above differential circuit allows a sufficient level of voltage headroom, and thus, the operation region can be enlarged, However, the other type of FDA may not improve the linearity since the improvement on the linearity of the entire differential circuit usually depends on the improvement on the linearity of the first and second transistors $MN_1$ and $MN_2$ of the amplification circuit.

SUMMARY OF THE INVENTION

Accordingly, the present invention is directed to provide a differential amplification circuit that can overcome a voltage headroom limitation, enhance a CMRR or IIP2, and improve third-order intercept point (IIP3).

The present invention is also directed to provide a differential amplification circuit that can improve the linearity thereof.

According to an embodiment of the present invention, a differential amplification circuit with improved linearity comprises a main differential amplification unit differentially amplifying a first and a second input signals; a main bias unit biasing the main differential amplification unit; a first current source coupled in series between a power supply voltage terminal and the main bias unit; and an auxiliary differential amplification unit differentially amplifying the first and the second input signal and coupled to the main differential amplification unit, Consistent with the embodiment of the present invention, the differential amplification circuit further comprises a first load and a second load coupled between the power supply voltage terminal and the main differential amplification unit Consistent with the embodiment of the present invention, the main differential amplification unit comprises a first transistor and a second transistor, each comprising first to third terminals wherein the first transistor and the second transistors are configured with a common-source circuit, each.

Consistent with the embodiment of the present invention, the auxiliary differential amplification unit comprises a third transistor and a fourth transistor, each comprising first to third terminals, wherein the third transistor and the fourth transistor are configured with a common-source circuit, each, Consistent with the embodiment of the present invention, the first transistor and the third transistor are coupled together; and the second transistor and the fourth transistor are coupled together.

Consistent with the embodiment of the present invention, the first transistor and the third transistor have a different transconductance characteristic; and the second transistor and the fourth transistor has a different transconductance characteristic.

Consistent with the embodiment of the present invention, the auxiliary differential amplification unit comprises one or more than one transistor coupled in parallel.

Consistent with the embodiment of the present invention, the main bias unit comprises a fifth transistor and a sixth transistor, each comprising first to third terminals, wherein the fifth transistor and the sixth transistor are configured with a common-source circuit, each, and the first transistor and the fifth transistor are coupled together; and the second transistor and the sixth transistor are coupled together.

Consistent with the embodiment of the present invention, the differential amplification circuit may further comprise a seventh transistor configured with a common-source circuit; and a second current source coupled in series between the power supply voltage terminal and the seventh transistor, wherein the auxiliary bias unit biases the auxiliary differential amplification unit.

Consistent with the embodiment of the present invention, the first to seventh transistors are one of metal-oxide semiconductor field effect transistors (MOSFETs) and bipolar junction transistors (BTJs).

Detailed description of various embodiments of the present invention will be provided herein below with reference to the accompanying drawings, Various features and advantages of the present invention will now be described more fully with reference to the accompanying drawings, in which exemplary embodiments of the invention on an amplification circuit with improved linearity and a frequency converter using the same are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Also, the invention is defined within the scope of the appended claims. Like reference numerals denote like elements even in different drawings.

BRIEF DESCRIPTION OF THE DRAWINGS

The invention will be described in detail with reference to the following drawings in which like numerals refer to like elements.

DETAILED DESCRIPTION OF EMBODIMENTS

Embodiments of the present invention will be described in a more detailed manner with reference to the drawings.

Figure 1:
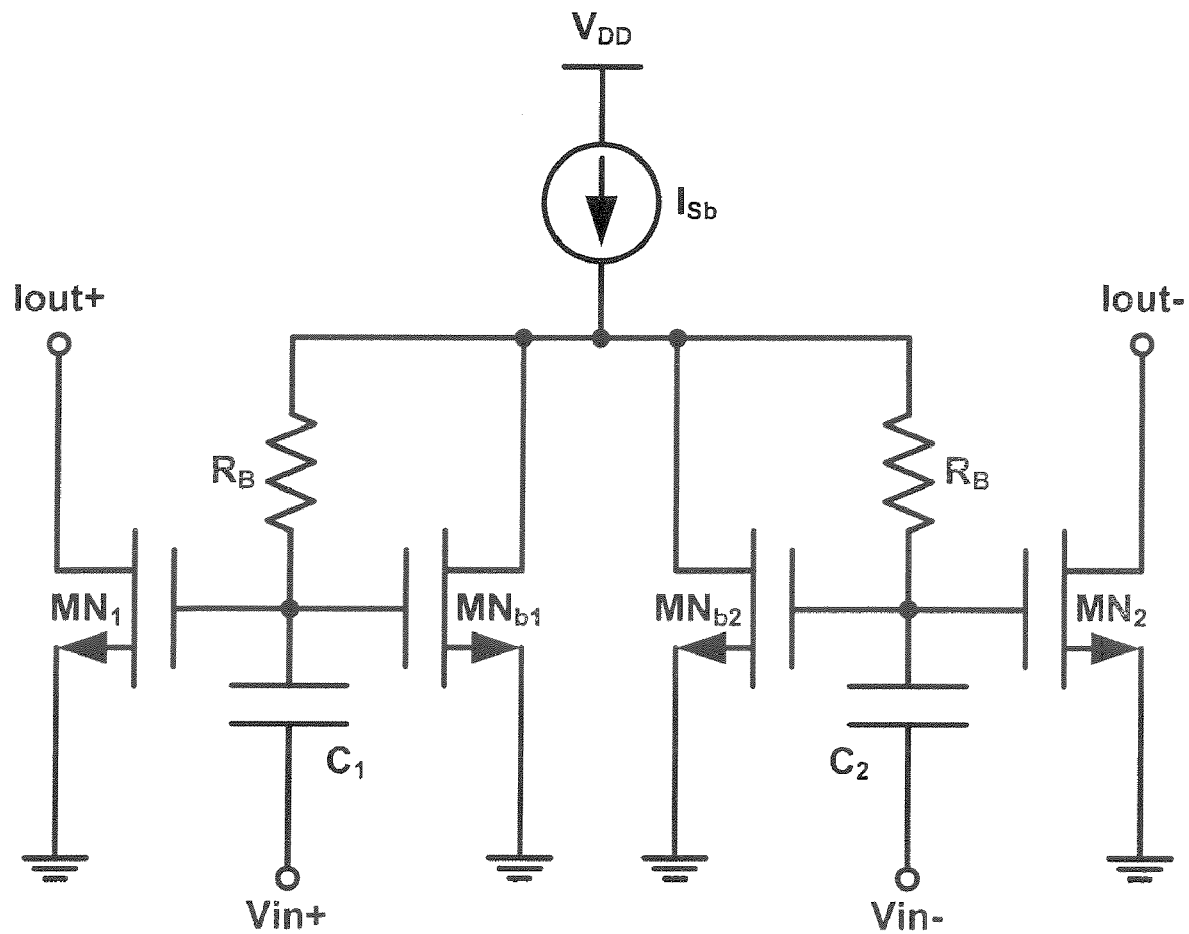
FIG. 1 illustrates a simplified diagram of a typical differential amplification circuit introduced by Nokia Corporation.
Figure 2:
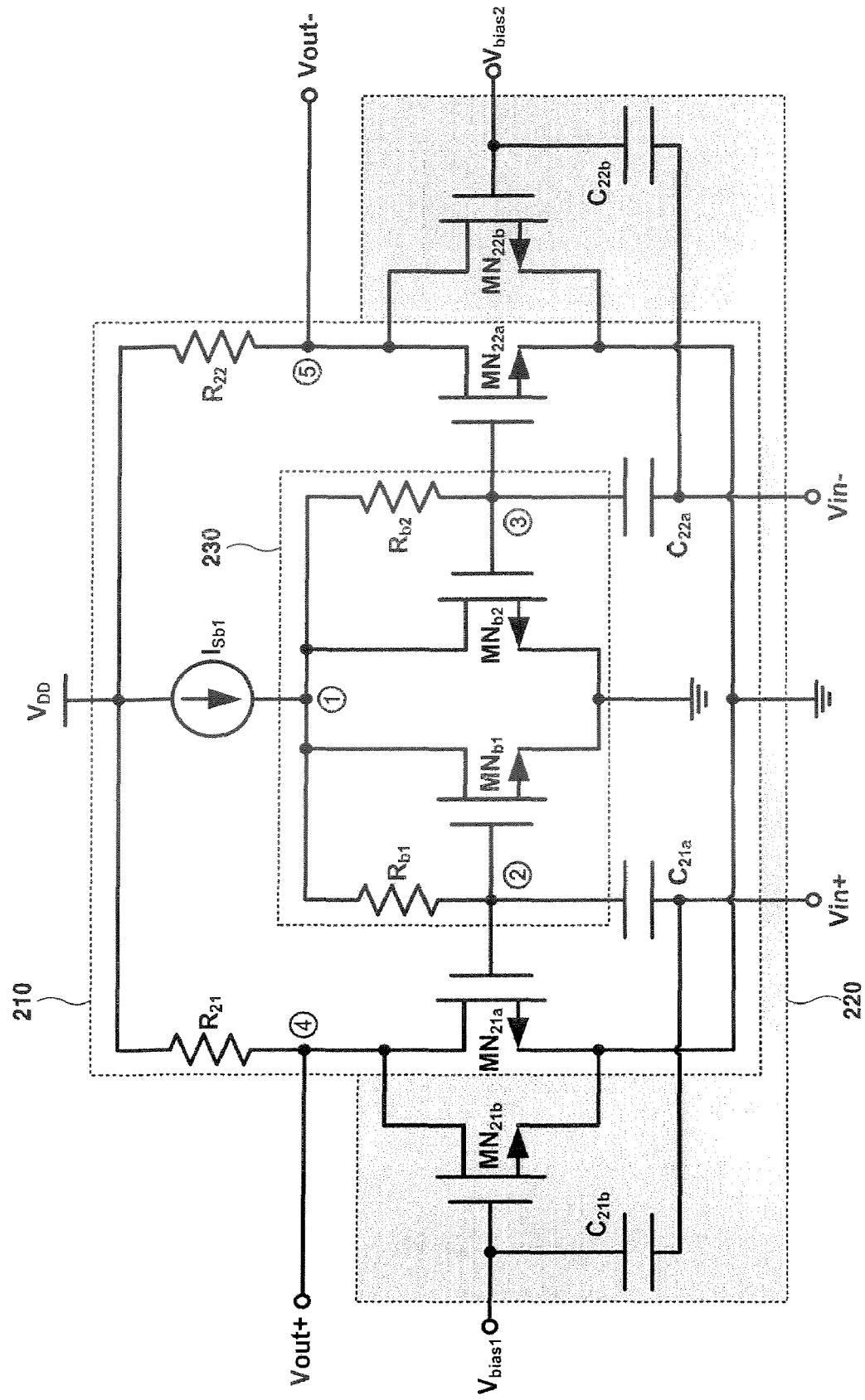
FIG. 2 illustrates a simplified diagram of a linearity-improved differential amplification circuit according to an embodiment of the present invention.

FIG. 2 illustrates a simplified diagram of a linearity-improved amplification circuit according to an embodiment of the present invention.

The differential amplification circuit comprises a main differential amplification unit 210, an auxiliary differential amplification unit 220, a main bias unit 230, and a current source $I_{sb1}$.

The main differential amplification unit 210 comprises a first transistor $MN_{21a}$, a second transistor $MN_{22a}$, a first capacitor $C_{21a}$, a second capacitor $C_{22a}$ a first load terminal $R_{21}$, and a second load terminal $R_{22}$.

The auxiliary differential amplification unit 220 comprises a third transistor $MN_{21b}$, a fourth transistor $MN_{22b}$, and a third capacitor $C_{21b}$, and a fourth capacitor $C_{22b}$.

The main bias unit 230 comprises a fifth transistor $MN_{b1}$, a sixth transistor $MN_{b2}$, a first bias resistor $R_{b1}$, and a second bias resistor $R_{b2}$.

A gate terminal of the first transistor $MN_{21a}$ is coupled to a node ②. A drain terminal of the first transistor $MN_{21a}$ is coupled to a node ④, and a source terminal of the first transistor $M_{21a}$ is coupled to a ground terminal.

A gate terminal of the second transistor $MN_{22a}$ is coupled to a node ③. A drain terminal of the second transistor $MN_{22a}$ is coupled to a node ⑤, and a source terminal of the second transistor $MN_{22a}$ is coupled to the ground terminal.

A gate terminal of the third transistor $MN_{21b}$ is coupled to one common terminal between a first bias terminal $V_{bias1}$ and the third capacitor $C_{21b}$. A drain terminal of the third transistor $MN_{21b}$ is coupled to the node ④, and a source terminal of the third transistor $MN_{21b}$ is coupled to the ground terminal.

A gate terminal of the fourth transistor $MN_{22b}$ is coupled to one common terminal between a second bias terminal and the fourth capacitor $C_{22b}$. A drain terminal of the fourth transistor $MN_{22b}$ is coupled to the node ⑤, and a source terminal of the fourth transistor $MN_{22b}$ is coupled to the ground terminal.

A drain terminal of the fifth transistor $MN_{b1}$ is coupled to a node ①, and a gate terminal of the fifth transistor $MN_{b1}$ is coupled to the node ②. A source terminal of the fifth transistor $MN_{b1}$ is coupled to the ground terminal.

A drain terminal of the sixth transistor $MN_{b2}$ is coupled to the node ①, and a gate terminal of the sixth transistor $MN_{b2}$ is coupled to the node ③. A source terminal of the sixth transistor $MN_{b2}$ is coupled to the ground terminal.

One terminal of the first bias resistor $R_{b1}$ is coupled to the node ①, and the other terminal of the first bias resistor $R_{b1}$ is coupled to the node ②.

One terminal of the second bias resistor $R_{b2}$ is coupled to the node ①, and the other terminal of the second bias resistor $R_{b2}$ is coupled to the node ③.

An output terminal of the current source $I_{sb1}$ is coupled to the node ①, and an input terminal of the current source $I_{sb1}$ is supplied with a power supply voltage $V_{DD}$.

One terminal of the first capacitor $C_{21a}$ is coupled to the node ②, and the other terminal of the first capacitor $C_{21a}$ is supplied with a first input voltage Vin+.

One terminal of the second capacitor $C_{22a}$ is coupled to the node ③, and the other terminal of the second capacitor $C_{22a}$ is supplied with a second input voltage Vin−.

The first input voltage Vin+ is supplied to the other terminal of the first capacitor $C_{21a}$ and the other terminal of the third capacitor $C_{21b}$. The second input voltage Vin− is supplied to the other terminal of the second capacitor $C_{22a}$ and the other terminal of the fourth capacitor $C_{22b}$.

One end of the first load terminal $R_{21}$ is coupled to the node ④, and the other end of the first load terminal $R_{21}$ is supplied with the power supply voltage $V_{DD}$.

One end of the second load terminal $R_{22}$ is coupled to the node ⑤, and the other end of the second load terminal $R_{22}$ is supplied with the power supply voltage $V_{DD}$.

A first output terminal Vout+ is coupled to the node ④, and a second output terminal Vout− is coupled to the node ⑤.

When the first input voltage Vin+ and the second input voltage Vin− are supplied, the first to fourth capacitors $C_{21a}$, $C_{22a}$, $C_{21b}$, and $C_{22b}$ block DC components of the first and second input voltages Vin+ and Vin−. Herein, the first to fourth capacitors $C_{21a}$, $C_{22a}$, $C_{21b}$, and $C_{22b}$ serve as a DC-blocking circuit.

The first transistor $MN_{21a}$ is biased due to the current source $I_{sb1}$ supplied to the first bias resistor $R_{b1}$ from a power supply voltage $V_{DD}$ terminal that is coupled to the fifth transistor $MN_{b1}$.

The second transistor $MN_{22a}$ is biased due to the current source $I_{sb1}$ supplied to the second bias resistor $R_{b1}$ from the power supply voltage $V_{DD}$ terminal that is coupled to the sixth transistor $MN_{b2}$.

Due to the above circuit configuration, when the first and second input voltages Vin+ and Vin− that do not have the DC components are supplied to the main differential amplification unit 210, the main differential amplification unit 210 amplifies a difference between the first input voltage Vin+ and the second input voltage Vin− and outputs the amplified voltage difference.

Particularly, the main differential amplification unit 210 with the current source $I_{sb1}$ is a FDA, and thus has a high CMRR and IIP2.

The first transistor $MN_{21a}$ of the main differential amplification unit 210 is coupled with the third transistor $MN_{21b}$ of the auxiliary differential amplification unit 220. The third transistor $MN_{21b}$ is biased due to a first bias voltage $V_{bias1}$.

The auxiliary differential amplification unit 220 uses a method of offsetting the non-linearity of the main differential amplification unit 210 with use of a pseudo differential amplifier (PDA).

More specifically, to improve the linearity, the transconductance of the third transistor $MN_{21b}$, which is typically expressed as "gm"," is used to change a negative value of the transconductance gm" of the first transistor $MN_{21a}$ into a positive value thereof, so that the transconductance gm" can be ignored.

On the basis of the same circuit configuration, the second transistor $MN_{22a}$ of the main differential amplification unit 210 is coupled with the fourth transistor $MN_{22b}$ of the auxiliary differential amplification unit 220, and the fourth transistor $MN_{22b}$ is biased due to a second bias voltage $V_{bias2}$.

To improve the linearity, the transconductance gm" of the fourth transistor $MN_{22b}$ is used to change a negative value of the transconductance gm" of the second transistor $MN_{22a}$ into a positive value thereof, so that the transconductance gm" can be ignored.

That is, optimum values of the first and second bias voltages $V_{bias1}$ and $V_{bias2}$ that can reduce the non-linearity of the first and second transistors $MN_{21a}$ and $MN_{22a}$ of the illustrated differential amplification circuit are set such that an added value of a second derivative value of the transconductance (i.e., gm") of the first and second transistors $MN_{21a}$ and $MN_{22a}$ with respect to a gate-source voltage and a second derivative value of the transconductance (i.e., gm") of the third and fourth transistors $MN_{21b}$ and $MN_{22b}$ with respect to a gate-source voltage is minimum in the operation region of the entire circuit.

Due to the illustrated circuit configuration, the linearity of the differential amplification circuit can be improved. The biasing is applied such that the first and second transistors $M_{21a}$ and $MN_{22a}$ operate in a saturation region, while the third and fourth transistors $MN_{21b}$ and $MN_{22b}$ operate in a sub-threshold region.

The auxiliary differential amplification unit 220 has almost no gain since current barely flows to the third and fourth transistors $MN_{21b}$ and $MN_{22b}$ of the auxiliary differential amplification unit 220. Therefore, the CMMR is high because the CMMR performs operations that depend on the main differential amplification unit 210. This high CMMR leads to high IIP2. As a result, the linearity can be improved along with enhancing the advantages of the differential amplification circuit.

Figure 3:
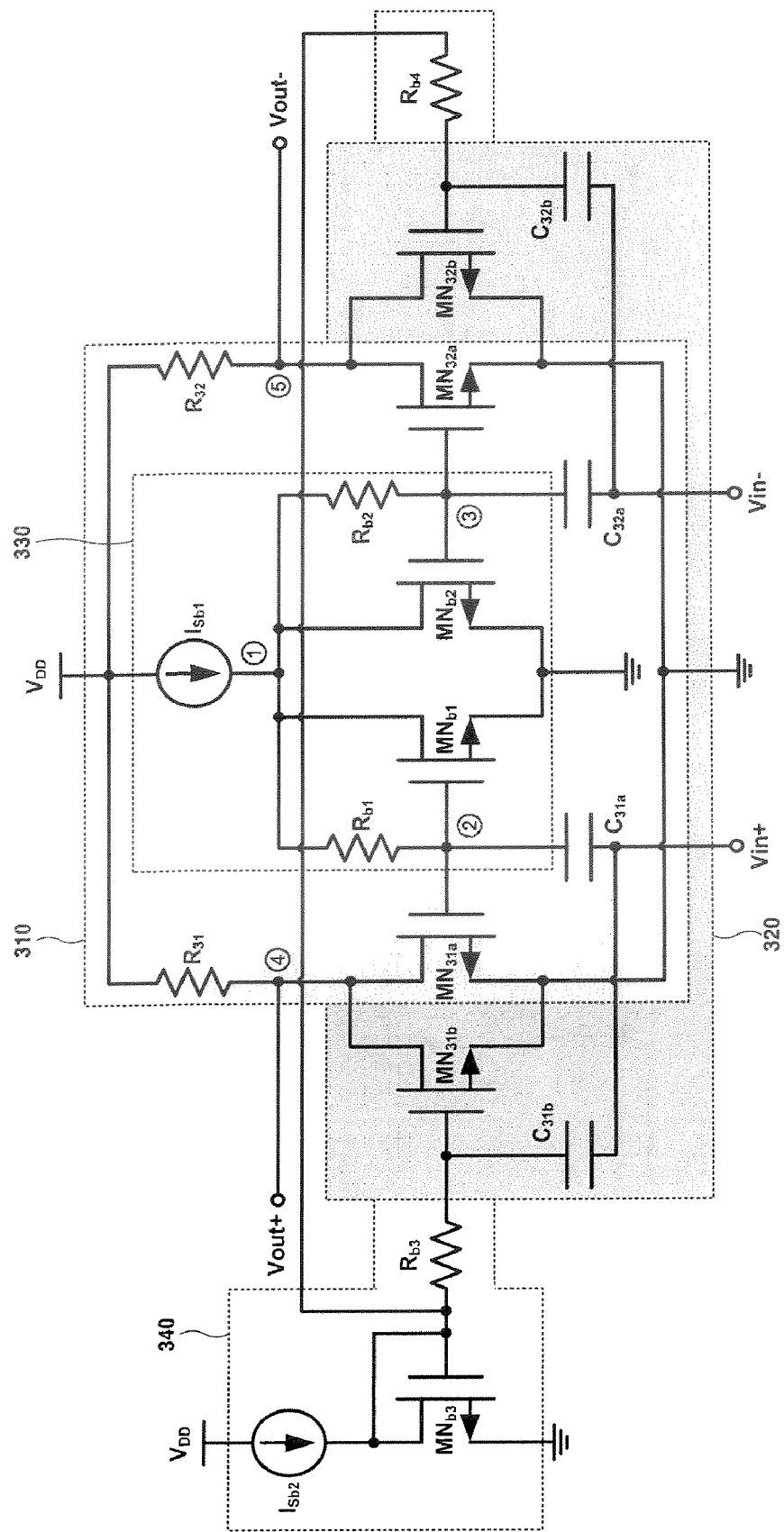
FIG. 3 illustrates a simplified diagram of a linearity-improved differential amplification circuit according to another embodiment of the present invention.

FIG. 3 illustrates a simplified diagram of a linearity-improved differential amplification circuit according to another embodiment of the present invention.

The differential amplification circuit comprises a main differential amplification unit 310, an auxiliary differential amplification unit 320, a main bias unit 330, an auxiliary bias unit 340, and a current source $I_{sb1}$.

The main differential amplification unit 310 comprises a first transistor $MN_{31a}$, a second transistor $MN_{32a}$, a first capacitor $C_{31a}$, a second capacitor $C_{32a}$, a first load terminal $R_{31}$ and a second load terminal $R_{32}$.

The auxiliary differential amplification unit 320 comprises a third transistor $MN_{31b}$, a fourth transistor $MN_{32b}$, and a third capacitor $C_{31b}$, and a fourth capacitor $C_{32b}$.

The main bias unit 330 comprises a fifth transistor $MN_{b1}$, a sixth transistor $MN_{b2}$, a first bias resistor $R_{b1}$, and a second bias resistor $R_{b2}$.

The auxiliary bias unit 340 comprises a seventh transistor $MN_{b3}$, a third bias resistor $R_{b3}$, a fourth bias resistor $R_{b4}$, and another current source $I_{sb2}$.

A gate terminal of the first transistor $MN_{31a}$ is coupled to a node ②. A drain terminal of the first transistor $MN_{31a}$ is coupled to a node ④, and a source terminal of the first transistor $MN_{31a}$ is coupled to a ground terminal.

A gate terminal of the second transistor $MN_{32a}$ is coupled to a node ③. A drain terminal of the second transistor $MN_{32a}$ is coupled to a node ⑤, and a source terminal of the second transistor $M_{32a}$ is coupled to the ground terminal.

A gate terminal of the third transistor $MN_{21b}$ is coupled to one common terminal between the third bias terminal $R_{b3}$ and the third capacitor $C_{31b}$. A drain terminal of the third transistor $MN_{31b}$ is coupled to the node ④, and a source terminal of the third transistor $MN_{31b}$ is coupled to the ground terminal.

A gate terminal of the fourth transistor $MN_{32b}$ is coupled to one common terminal between the fourth bias resistor $R_{b4}$ and the fourth capacitor $C_{32b}$. A drain terminal of the fourth transistor $MN_{32b}$ is coupled to the node ⑤, and a source terminal of the fourth transistor $MN_{32b}$ is coupled to the ground terminal.

A drain terminal of the fifth transistor $MN_{b1}$ is coupled to a node ①, and a gate terminal of the fifth transistor $MN_{b1}$ is coupled to the node ②. A source terminal of the fifth transistor $MN_{b1}$ is coupled to the ground terminal.

A drain terminal of the sixth transistor $MN_{b2}$ is coupled to the node ①, and a gate terminal of the sixth transistor $MN_{b2}$ is coupled to the node ③. A source terminal of the sixth transistor $MN_{b2}$ is coupled to the ground terminal.

One terminal of the first bias resistor $R_{b1}$ is coupled to the node ①, and the other terminal of the first bias resistor $R_{b1}$ is coupled to the node ②.

One terminal of the second bias resistor $R_{b2}$ is coupled to the node ①, and the other terminal of the second bias resistor $R_{b2}$ is coupled to the node ③, An output terminal of the current source $I_{sb1}$ is coupled to the node ①, and an input terminal of the current source $I_{sb1}$ is supplied with a power supply voltage $V_{DD}$.

One terminal of the first capacitor $C_{31a}$ is coupled to the node ②, and the other terminal of the first capacitor $C_{31s}$ is supplied with a first input voltage Vin+.

One terminal of the second capacitor $C_{32a}$ is coupled to the node ③, and the other terminal of the second capacitor $C_{32a}$ is supplied with a second input voltage Vin−.

The first input voltage Vin+ is supplied to the other terminal of the first capacitor $C_{31a}$ and the other terminal of the third capacitor $C_{31b}$. The second input voltage Vin− is supplied to the other terminal of the second capacitor $C_{32a}$ and the other terminal of the fourth capacitor $C_{32b}$.

One end of the first load terminal $R_{31}$ is coupled to the node ④, and the other end of the first load terminal $R_{31}$ is supplied with the power supply voltage $V_{DD}$.

One end of the second load terminal $R_{32}$ is coupled to the node ⑤, and the other end of the second load terminal $R_{32}$ is supplied with the power supply voltage $V_{DD}$.

A first output terminal Vout+ is coupled to the node ④, and a second output terminal Vout− is coupled to the node ⑤.

The other terminal of the third bias resistor $R_{b3}$ and the other terminal of the fourth bias resistor $R_{b4}$ are coupled to a gate terminal of the seventh transistor $MN_{b3}$. The gate terminal and a drain terminal of the seventh transistor $MN_{b3}$ are coupled to each other, The drain terminal of the seventh transistor $MN_{b3}$ is coupled to an output terminal of the other current source $I_{sb2}$, and a source terminal of the seventh transistor $MN_{b3}$ is coupled to the ground terminal.

When the first input voltage Vin+ and the second input voltage Vin− are supplied, the first to fourth capacitors $C_{31a}$, $C_{32a}$, $C_{31b}$, and $C_{32b}$ block DC components of the first and second input voltages Vin+ and Vin−.

Herein, the first to fourth capacitors $C_{31a}$, $C_{32a}$, $C_{31b}$, and $C_{32b}$ serve as a DC-blocking circuit.

The first transistor $MN_{31a}$ is biased due to the current source $I_{sb1}$ supplied to the first bias resistor $R_{b1}$ from a power supply voltage $V_{DD}$ terminal coupled to the fifth transistor $M_{b1}$.

The second transistor $MN_{32a}$ is biased due to the current source $I_{sb1}$ supplied to the second bias resistor $R_{b1}$ from the power supply voltage $V_{DD}$ terminal coupled to the sixth transistor $MN_{b2}$.

Due to the above circuit configuration, when the first and second input voltages Vin+ and Vin− that do not have the DC components are supplied to the main differential amplification unit 310, the main differential amplification unit 310 amplifies a difference between the first input voltage Vin+ and the second input voltage Vin− and outputs the amplified voltage difference.

Particularly, the main differential amplification unit 310 is a FDA comprising the current sources, and thus has a high CMRR and IIP2.

The first transistor $MN_{31a}$ of the main differential amplification unit 310 is coupled with the third transistor $MN_{31b}$ of the auxiliary differential amplification unit 320. The third transistor $MN_{31b}$ is biased due to the auxiliary bias unit 340.

The auxiliary differential amplification unit 320 uses a method of offsetting the non-linearity of the main differential amplification unit 310 with use of a PDA, More specifically, to improve the linearity, the transconductance gm" of the third transistor $MN_{31b}$ is used to change a negative value of the transconductance gm" of the first transistor $MN_{31a}$, into a positive value thereof, so that the transconductance gm" can be ignored.

On the basis of the same circuit configuration, the second transistor $MN_{32a}$ of the main differential amplification unit 310 is coupled with the fourth transistor $MN_{32b}$ of the auxiliary differential amplification unit 320, and the fourth transistor $MN_{32b}$ is biased due to the auxiliary bias unit 340.

To improve the linearity, the transconductance gm" of the fourth transistor $MN_{32b}$ is used to change a negative value of the transconductance gm" of the second transistor $MN_{32a}$ into a positive value thereof, so that the transconductance gm" can be ignored.

That is, optimum values of bias voltages that can reduce the non-linearity of the first and second transistors $MN_{31a}$ and $MN_{32a}$ of the illustrated differential amplification circuit are set such that an added value of a second derivative value of the transconductance (i.e., gm") of the first and second transistors $MN_{31a}$ and $MN_{32a}$ with respect to a gate-source voltage of the seventh transistor $MN_{b3}$ of the auxiliary bias unit 340 and a second derivative value of the transconductance (i.e., gm") of the third and fourth transistors $MN_{31b}$ and $MN_{32b}$ with respect to a gate-source voltage thereof is integrated to a minimum value in the operation region of the entire circuit.

Due to the illustrated circuit configuration, the linearity of the differential amplification circuit can be improved. The biasing is applied such that the first and second transistors $MN_{31a}$ and $MN_{32a}$ operate in a saturation region, while the third and fourth transistors $MN_{31b}$ and $MN_{32b}$ operate in a subthreshold region.

Figure 4:
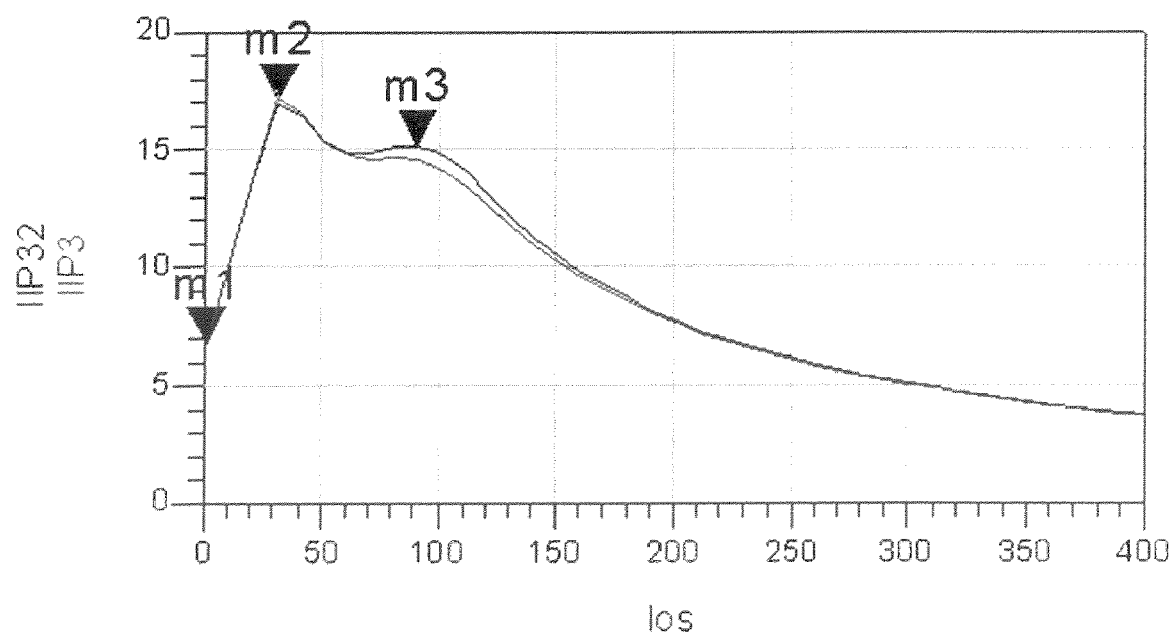
FIG. 4 illustrates a graph of a linearity characteristic exhibited by a linearity improved differential amplification circuit according to an embodiment of the present invention.

The auxiliary differential amplification unit 320 has almost no gain since current barely flows to the third and fourth transistors $MN_{31b}$ and $MN_{32b}$ of the auxiliary differential amplification unit 320. Therefore, the CMMR is high because the CMMR performs operations that depend on the main differential amplification unit 310. This high CMMR leads to high IIP2. As a result, the linearity can be improved along with enhancing the advantages of the differential amplification circuit, FIG. 4 illustrates a graph of a linearity characteristic exhibited by a linearity-improved differential amplification circuit according to an embodiment of the present invention.

When an Ios level is approximately 31.000 as marked with a reference denotation m2, a corresponding value of IIP3 is approximately 17.170 dBm. As a reference denotation m3 indicates, when an Ios level is approximately 91.000, a corresponding value of IIP3 is approximately 15.158 dBm. On the other hand, when an Ios level is approximately 0.000 as marked with a reference denotation m1, a corresponding value of IIP3 is approximately 6.810 dBm.

The Ios level of 0.000 (refer to m1) indicates that the typical differential amplification circuit that does not comprise an auxiliary differential amplification circuit is used.

When the simulation on IIP3 is performed while changing a bias condition of the auxiliary differential amplification circuit, the linearity of the differential amplification circuit is improved in a wide bias region.

According to various embodiments of the present invention, the differential amplification circuit can overcome the voltage headroom limitation, increase the CMRR or IIP2, which are the advantages when using the differential amplification circuit, and improve the IIP3.

Also, the circuit configuration according to the embodiments of the present invention allows the differential amplification circuit to have the improved linearity.

The invention being thus described, it will be obvious that the same may be varied in many ways. Such variations are not to be regarded as a departure from the spirit and scope of the invention and all such modifications as would be obvious to one skilled in the art are intended to be included within the scope of the following claims.

What is claimed is:

1. A differential amplification circuit with improved linearity, comprising:
    a main differential amplification unit differentially amplifying a first and a second input signals;
    a main bias unit biasing the main differential amplification unit to provide a bias voltage to the main differential amplification unit;
    a first current source coupled in series between a power supply voltage terminal and the main bias unit; and
    an auxiliary differential amplification unit differentially amplifying the first and the second input signal and coupled to the main differential amplification unit.

2. The differential amplification circuit of claim 1, wherein the differential amplification circuit further comprises a first load and a second load coupled between the power supply voltage terminal and the main differential amplification unit.

3. The differential amplification circuit of claim 2, wherein the main differential amplification unit comprises a first transistor and a second transistor, each comprising first, second, and third terminals, wherein the first transistor and the second transistor are configured with a common-source circuit, each.

4. The differential amplification circuit of claim 3, wherein the auxiliary differential amplification unit comprises a third transistor and a fourth transistor, each comprising first, second, and third terminals, wherein the third transistor and the fourth transistor are configured with a common-source circuit, each.

5. The differential amplification circuit of claim 4, wherein the first transistor and the third transistor are coupled together; and the second transistor and the fourth transistor are coupled together.

6. The differential amplification circuit of claim 5, wherein the first transistor and the third transistor have a different transconductance characteristic; and the second transistor and the fourth transistor has a different transconductance characteristic.

7. The differential amplification circuit of claim 4, wherein the auxiliary differential amplification unit comprises one or more than one transistor coupled in parallel.

8. A differential amplification circuit with improved linearity, comprising:
   a main differential amplification unit differentially amplifying a first and a second input signals;
   a main bias unit biasing the main differential amplification unit;
   a first current source coupled in series between a power supply voltage terminal and the main bias unit; and
   an auxiliary differential amplification unit differentially amplifying the first and the second input signal and coupled to the main differential amplification unit,
   wherein the main differential amplification unit comprises a first transistor and a second transistor, each comprising first, second, and third terminals, wherein the first transistor and the second transistor are configured with a common-source circuit, each, and
   wherein the main bias unit comprises a fifth transistor and a sixth transistor, each comprising first, second, and third terminals, wherein the fifth transistor and the sixth transistor are configured with a common-source circuit, each, and the first transistor and the fifth transistor are coupled together; and the second transistor and the sixth transistor are coupled together.

9. The differential amplification circuit of claim 1, further comprising an auxiliary bias unit comprising:
   a transistor configured with a common-source circuit; and
   a second current source coupled in series between the power supply voltage terminal and the transistor, wherein the auxiliary bias unit biases the auxiliary differential amplification unit.

10. The differential amplification circuit of claim 9, wherein the transistor is a metal-oxide semiconductor field effect transistor (MOSFET) or a bipolar junction transistor (BJT).

11. The differential amplification circuit of claim 5,
    wherein the first terminal of the first transistor is coupled with the first terminal of the third transistor,
    wherein the second terminal of the first transistor is coupled with the second terminal of the third transistor,
    wherein the first terminal of the second transistor is coupled with the first terminal of the fourth transistor, and
    wherein the second terminal of the second transistor is coupled with the second terminal of the fourth transistor.

12. The differential amplification circuit of claim 5,
    wherein the second terminal of the third transistor is coupled to a first bias voltage terminal for operating the third transistor in a sub-threshold region thereof while the first transistor is operated in a saturation region thereof, and
    wherein the second terminal of the fourth transistor is coupled to a second bias voltage terminal for operating the fourth transistor in a sub-threshold region thereof while the second transistor is operated in a saturation region thereof.

* * * * *